(12) United States Patent
Kim

(10) Patent No.: US 8,101,520 B2
(45) Date of Patent: Jan. 24, 2012

(54) METHOD OF FORMING PATTERNS OF SEMICONDUCTOR DEVICE

(75) Inventor: Tae Kyung Kim, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/650,462

(22) Filed: Dec. 30, 2009

(65) Prior Publication Data

US 2010/0323520 A1 Dec. 23, 2010

(30) Foreign Application Priority Data

Jun. 17, 2009 (KR) ........................ 10-2009-0053837

(51) Int. Cl.
*H01L 21/44* (2006.01)
(52) U.S. Cl. ...................................... 438/674
(58) Field of Classification Search ................. None
See application file for complete search history.

(56) References Cited

U.S. PATENT DOCUMENTS

| 5,960,297 A * | 9/1999 | Saki .............................. 438/424 |
| 7,312,158 B2 * | 12/2007 | Miyagawa et al. ........... 438/737 |
| 7,745,338 B2 * | 6/2010 | Cha et al. ...................... 438/700 |
| 2008/0131793 A1 * | 6/2008 | Lee et al. .......................... 430/5 |
| 2011/0049618 A1 * | 3/2011 | Lee et al. ...................... 257/330 |

FOREIGN PATENT DOCUMENTS

| KR | 10-2003-0089564 | 11/2003 |
| KR | 1020080020183 | 8/2006 |

\* cited by examiner

*Primary Examiner* — Scott B Geyer
(74) *Attorney, Agent, or Firm* — Marshall, Gerstein & Borun LLP

(57) ABSTRACT

A method of forming patterns of a semiconductor device comprises forming a number of first insulating patterns that define sidewalls by patterning a first insulating layer formed over a semiconductor substrate, forming second insulating patterns, each second insulating pattern comprising a horizontal portion having two ends and being parallel to the semiconductor substrate and spaced protruding portions protruding from both ends of the horizontal portion parallel to the sidewalls of the first insulating patterns, forming third insulating patterns each filling a space between the protruding portions, removing the protruding portions to form trenches, and forming conductive patterns within the respective trenches.

16 Claims, 4 Drawing Sheets

METHOD OF FORMING PATTERNS OF SEMICONDUCTOR DEVICE

CROSS-REFERENCE TO RELATED APPLICATION

Priority to Korean patent application number 10-2009-0053837 filed on Jun. 17, 2009, the entire disclosure of which is incorporated by reference herein, is claimed.

BACKGROUND

One or more embodiments relate generally to a method of manufacturing a semiconductor device and, more particularly, to a method of forming the patterns of a semiconductor device that is capable of making micro intervals between conductive patterns of a semiconductor device.

For highly-integrated semiconductor devices, the design rule of the semiconductor devices is abruptly decreased. With such a reduction in the design rule of the devices, intervals between patterns constituting the semiconductor device become micro in scale. In general, the shape of the patterns constituting the semiconductor device is determined by the shape of a photoresist pattern formed through a photolithography process. The photolithography process has reached a limit in making micro the pattern pitch of the semiconductor device because of limited exposure resolution. To overcome limited exposure resolution, spacer patterning technology is used.

In spacer patterning technology, auxiliary patterns are formed at specific intervals using a photolithography process, and a spacer is formed on sidewalls of the auxiliary patterns. Here, the spacer surrounds the auxiliary pattern. To separate the spacers into individual line patterns, a mask process and an etch process are performed.

The mask process is used to form first hard mask patterns for blocking portions that will become the individual line patterns of the spacer and for opening portions that should be removed in order to separate the spacer into the individual line patterns. The etch process is performed to etch the spacers using the first hard mask patterns as an etch barrier.

If the spacers that are separated into the individual line patterns by the mask process and the etch process remain, a hard mask layer beneath the spacers is etched using the remaining spacers as an etch barrier, thereby forming second hard mask patterns. Next, the patterns of the semiconductor device are patterned using the second hard mask patterns as an etch barrier. Here, the spacers remaining as the line patterns on both sides of each auxiliary pattern can have different widths.

Accordingly, odd-numbered lines and even-numbered lines of the patterns of the semiconductor device formed using the remaining spacers can have different widths. Further, the process is complicated because the additional hard mask layer must be formed in order to separate the spacer into the individual lines. In addition, the hard mask layer can have a failure when forming the hard mask layer because the mask layer has a stack structure of a number of layers. Moreover, a defect can occur in the pattern because of deterioration in adhesion characteristic between layers. Furthermore, a problem arises in that the spacer patterns or the hard mask patterns collapse during the patterning process due to deteriorated adhesion characteristics resulting from a reduced contact area of the spacer, the hard mask pattern, and an underlying layer according to the high degree of integration of the semiconductor device.

BRIEF SUMMARY

One or more embodiments relate to a method of forming patterns of a semiconductor device that is capable of simplifying the process and stabilizing a process of making microscale pattern pitch in the semiconductor device.

A method of forming patterns of a semiconductor device according to a first embodiment of this disclosure includes forming a number of first insulating patterns that define sidewalls by patterning a first insulating layer formed over a semiconductor substrate, forming second insulating patterns, each second insulating pattern comprising a horizontal portion having two ends and being parallel to the semiconductor substrate and spaced protruding portions protruding from both ends of the horizontal portion parallel to the sidewalls of the first insulating patterns, forming third insulating patterns, each third insulating pattern filling a space defined between the protruding portions, removing the protruding portions to form trenches, and forming conductive patterns within the respective trenches.

A method of forming patterns of a semiconductor device according to a second embodiment of this disclosure includes forming a number of first insulating patterns that define sidewalls by patterning a first insulating layer formed over a semiconductor substrate, forming second insulating patterns, each second insulating pattern comprising a horizontal portion having two ends and being parallel to the semiconductor substrate and spaced protruding portions protruding from both ends of the horizontal portion parallel to the sidewalls of the first insulating patterns, forming third insulating patterns, each third insulating pattern filling a space defined between the protruding portions, removing the third insulating patterns to form a trench between the protruding portions, lowering a height of the first insulating patterns to form auxiliary patterns, and forming conductive patterns within the respective trenches.

Forming the second insulating patterns and the third insulating patterns preferably comprises forming a second insulating layer over the semiconductor substrate comprising the first insulating patterns, forming a third insulating layer on the second insulating layer, and polishing the second insulating layer and the third insulating layer to thereby expose the first insulating patterns.

The second and third insulating layers preferably are formed using a deposition method having a step-coverage of 90% or more.

The second and third insulating layers preferably are formed using a furnace method or an atomic layer deposition (ALD) method.

The second insulating patterns preferably comprise material different from the material of the first insulating layer, and the third insulating patterns preferably comprise the same material as the first insulating layer.

The first insulating layer and the third insulating patterns preferably comprise an oxide layer, and the second insulating patterns preferably comprise a nitride layer.

In another preferred embodiment, the first insulating layer and the third insulating patterns comprise a nitride layer, and the second insulating patterns comprise an oxide layer.

An interval between the first insulating patterns preferably is three times as large as the width of each of the first insulating patterns.

DESCRIPTION OF EMBODIMENTS

Figure 1A:
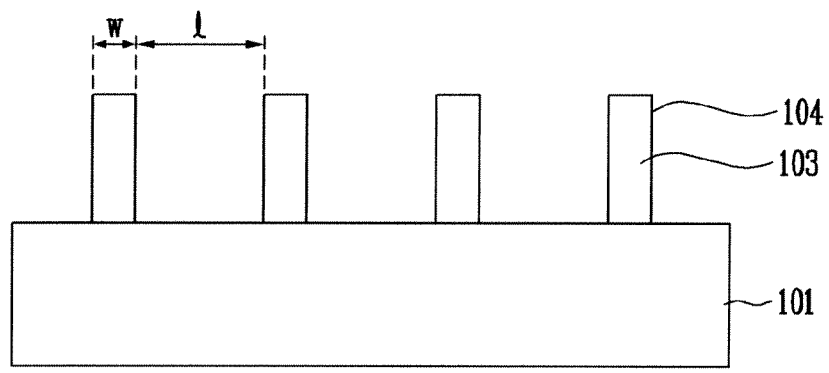
FIGS. 1A to 1G are cross-sectional views illustrating a method of forming patterns of a semiconductor device according to a first embodiment of this disclosure.

Hereinafter, preferred embodiments of the disclosure are described in detail below with reference to the accompanying drawings. The drawing figures are provided to allow those having ordinary skill in the art to understand the scope of the embodiments of the disclosure.

FIGS. 1A to 1G are cross-sectional views illustrating a method of forming patterns of a semiconductor device according to a first embodiment of this disclosure.

Referring to FIG. 1A, a plurality of first insulating patterns 103 are formed over a semiconductor substrate 101. The first insulating patterns define sidewalls 104. An interval 'I' between the first insulating patterns 103 preferably is at least three times as large as the width 'W' of each of the first insulating patterns 103 such that the first insulating patterns 103 can be formed in a subsequent process with a second insulating pattern interposed therebetween.

The first insulating patterns 103 preferably are formed by depositing a first insulating layer over the semiconductor substrate 101 and patterning the first insulating layer using a photolithography process including exposure and development processes. The first insulating layer preferably comprises an oxide layer or a nitride layer.

Figure 1B:
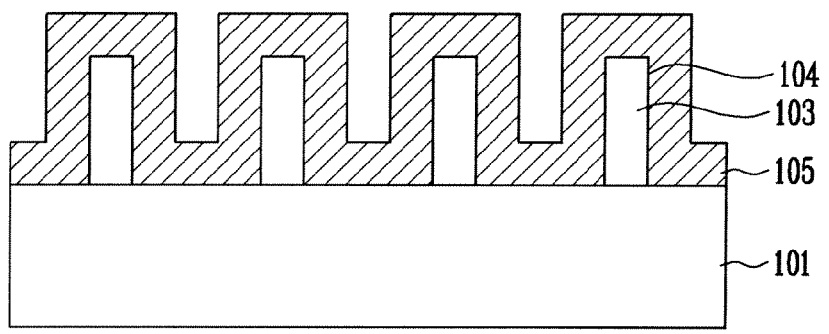

Referring to FIG. 1B, a second insulating layer 105 is deposited on the semiconductor substrate 101 including the surfaces of the first insulating patterns 103. The second insulating layer 105 preferably comprises a material different from the material of the first insulating layer. For example, if the first insulating layer comprises an oxide layer, the second insulating layer 105 preferably comprises a nitride layer. If the first insulating layer comprises a nitride layer, the second insulating layer 105 preferably comprises an oxide layer.

The second insulating layer 105 preferably has a uniform thickness while maintaining its step coverage formed by the first insulating patterns 103. To this end, the second insulating layer 105 preferably is deposited using a furnace method or an atomic layer deposition (ALD) method, preferably having a step coverage characteristic of 90% or more. When the second insulating layer 105 is deposited using a method having an excellent step coverage characteristic as described above, a space having a uniform width remains between the second insulating layers 105 that are formed on the sidewalls 104 of each of the first insulating patterns 103 and are formed to neighbor each other.

Furthermore, when the second insulating layer 105 is deposited using a method having an excellent step coverage characteristic, the second insulating layers 105 formed on the sidewalls 104 of the first insulating patterns 103 have a uniform thickness. When the second insulating layers 105 formed on the sidewalls 104 of the first insulating patterns 103 have a uniform thickness, trenches to be formed in a subsequent process can have a uniform width, and so the line width of a pattern formed within each of the trenches is uniform. Thus, when the second insulating layer 105 is deposited using a method having an excellent step coverage characteristic, odd-numbered patterns and even-numbered patterns of the semiconductor device that are alternately arranged in the same layer can be uniformly formed.

Figure 1C:
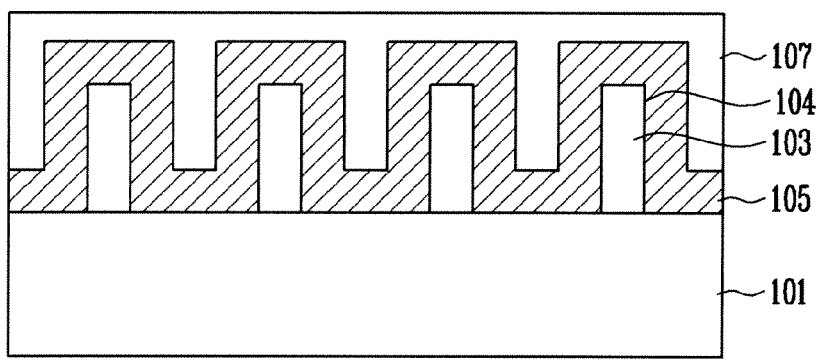

Referring to FIG. 1C, a third insulating layer 107 is deposited on the second insulating layer 105. The third insulating layer 107 preferably comprises the same material as the material of the second insulating layer 105. For example, if the second insulating layer comprises an oxide layer, the third insulating layer 107 preferably comprises an oxide layer. If the second insulating layer comprises a nitride layer, the third insulating layer 107 preferably comprises a nitride layer.

The third insulating layer 107 preferably is deposited using a furnace method or an ALD method having a step coverage characteristic of 90% or more. The third insulating layer 107 preferably fills the spaces between the second insulating layers 105 that are formed on the sidewalls 104 of the first insulating patterns 103, and neighbor each other.

Figure 1D:
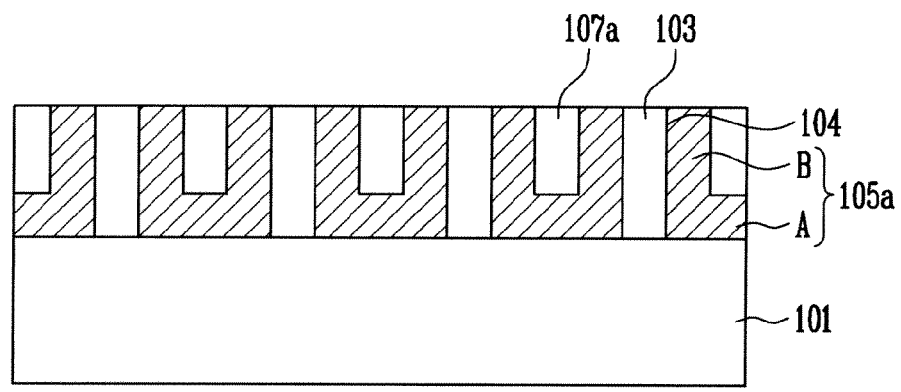

Referring to FIG. 1D, a first polishing process is performed to expose the first insulating patterns 103. The first polishing process preferably is performed using a chemical mechanical polishing (CMP) method.

The second insulating layer formed to surround each of the first insulating patterns 103 is separated into a number of second insulating patterns 105a, each second insulating pattern 105a having a first insulating pattern 103 interposed therebetween through the first polishing process. Here, the second insulating patterns 105a each include a horizontal portion A parallel to the semiconductor substrate 101 and spaced protruding portions B protruding from both ends of the horizontal portion A parallel to the sidewalls 104 of the first insulating patterns 103.

Furthermore, the third insulating layer filling the space between the second insulating layers 105 is separated into a number of third insulating patterns 107a each with the first and second insulating patterns 103, 105a interposed therebetween through the first polishing process. Each of the third insulating patterns 107a is formed in the space between the spaced protruding portions B of each of the second insulating patterns 105a.

Figure 1E:
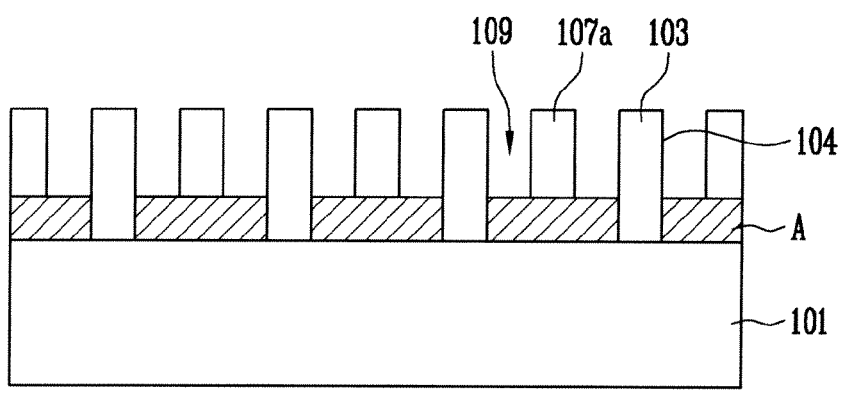

Referring to FIG. 1E, the protruding portions (refer to B of FIG. 1D) of the second insulating patterns (refer to 105a of FIG. 1D) are removed, preferably by a wet etch process, to form a trench 109 on both sides of each of the first insulating patterns 103. The trenches 109 are each formed on the horizontal portion A between the first insulating patterns 103 with the third insulating pattern 107a interposed therebetween.

When removing the protruding portions using the wet etch process, the first insulating patterns 103 and the third insulating patterns 107a remain intact because they are made of a different material from the second insulating patterns. Furthermore, the second insulating patterns are not all removed by the wet etch process, but each of the horizontal portions A of the second insulating patterns remains between the first insulating patterns 103.

Each of the horizontal portions A remaining between the first insulating patterns 103 functions to support the first insulating patterns 103 such that the first insulating patterns 103 do not collapse.

Figure 1F:
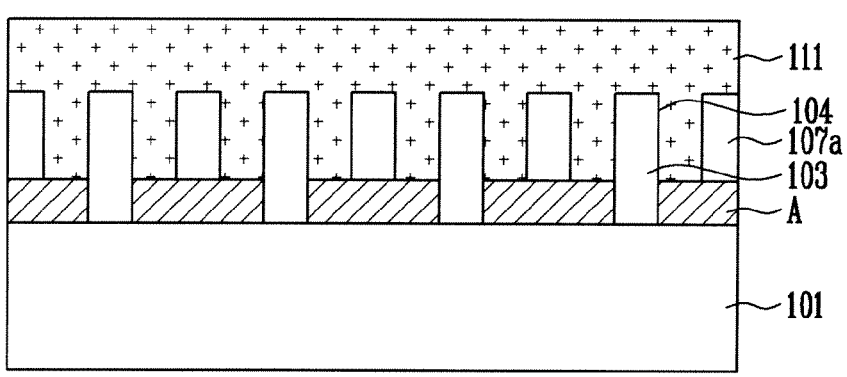

Referring to FIG. 1F, a conductive layer 111 is formed over the semiconductor substrate 101, including the trenches, in such a way as to fill the trenches (refer to 109 of FIG. 1E). The conductive layer 111 preferably comprises a metal material and preferably is formed using a chemical vapor deposition (CVD) or atomic layer deposition (ALD) method.

Figure 1G:
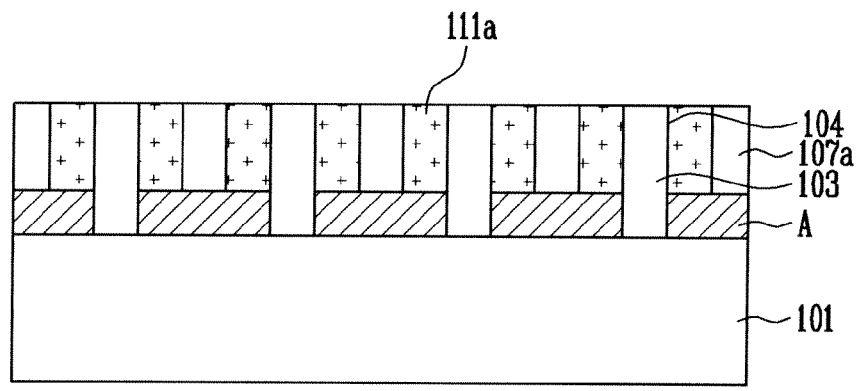

Referring to FIG. 1G, a second polishing process is performed to expose the first insulating patterns 103, thereby separating the conductive layer into a number of conductive patterns 111a. The second polishing process preferably is performed using a chemical mechanical polishing (CMP) method.

The conductive patterns 111a are formed within the respective trenches (refer to 109 of FIG. 1E). The conductive patterns 111a each can have a controlled width according to a deposition thickness of the second insulating layer (refer to 105 of FIG. 1B), and so have a micro width that is smaller than an exposure resolution. Accordingly, a pattern pitch of the conductive patterns 111a according to the first embodiment of this disclosure can be more smaller on a micro scale, than an exposure resolution. Furthermore, since the second insulating layer (refer to 105 of FIG. 1B) is deposited to a uniform thickness using the method having an excellent step coverage characteristic, a line width between the conductive patterns 111a can be uniform.

FIGS. 2A to 2D are cross-sectional views illustrating a method of forming patterns of a semiconductor device according to a second embodiment of this disclosure.

Figure 2A:
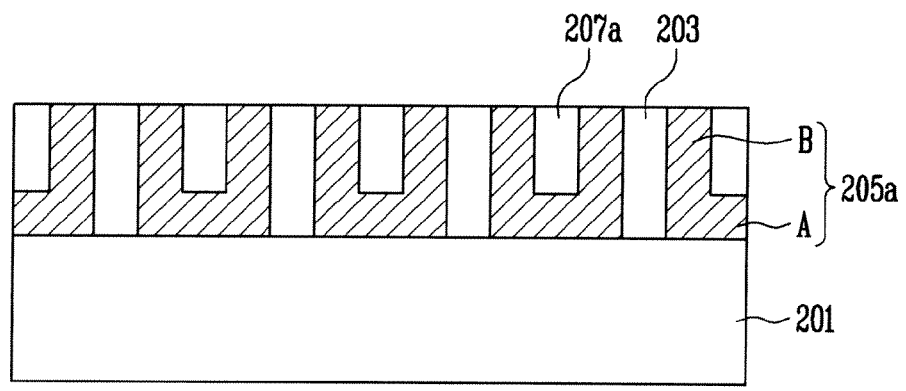
FIGS. 2A to 2D are cross-sectional views illustrating a method of forming patterns of a semiconductor device according to a second embodiment of this disclosure.

Referring to FIG. 2A, in the second embodiment of this disclosure, a number of first insulating patterns 203, a number of second insulating patterns 205a, and a number of third insulating patterns 207a are formed over a semiconductor substrate 201 using the same method as that described with reference to FIGS. 1A to 1D.

Figure 2B:
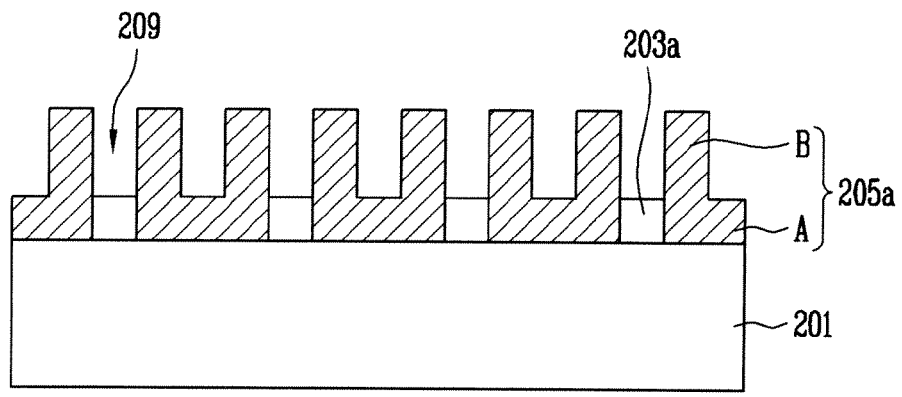

Referring to FIG. 2B, the height of the first insulating patterns (refer to 203 of FIG. 2A) is lowered to be equal to that of the horizontal portions A of the second insulating patterns 205a using a wet etch process, thereby forming auxiliary patterns 203a. In this case, the third insulating patterns (refer to 207an of FIG. 2A) are also removed. Accordingly, trenches 209 each are formed between protruding portions B of the second insulating patterns 205a.

Each of the auxiliary patterns 203a remaining between the second insulating patterns 205a functions to electrically isolate conductive patterns, formed in a subsequent process, and underlying patterns under the semiconductor substrate 101 from each other.

Furthermore, in the second embodiment of this disclosure, both the protruding portions B and horizontal portions A of each of the second insulating patterns 205a remain intact and maintain a U shape. This increases the contact area of the second insulating patterns 205a and the underlying semiconductor substrate 201 through the horizontal portions A. Accordingly, in the second embodiment of this disclosure, the second insulating patterns 205a can be prevented from collapsing because they have an improved adhesion characteristic.

Meanwhile, although the height of the first insulating patterns is lowered and the third insulating patterns are removed, preferably using a wet etch process, the second insulating patterns 205a remain intact because they are made of a different material from the first and the third insulating patterns.

Figure 2C:
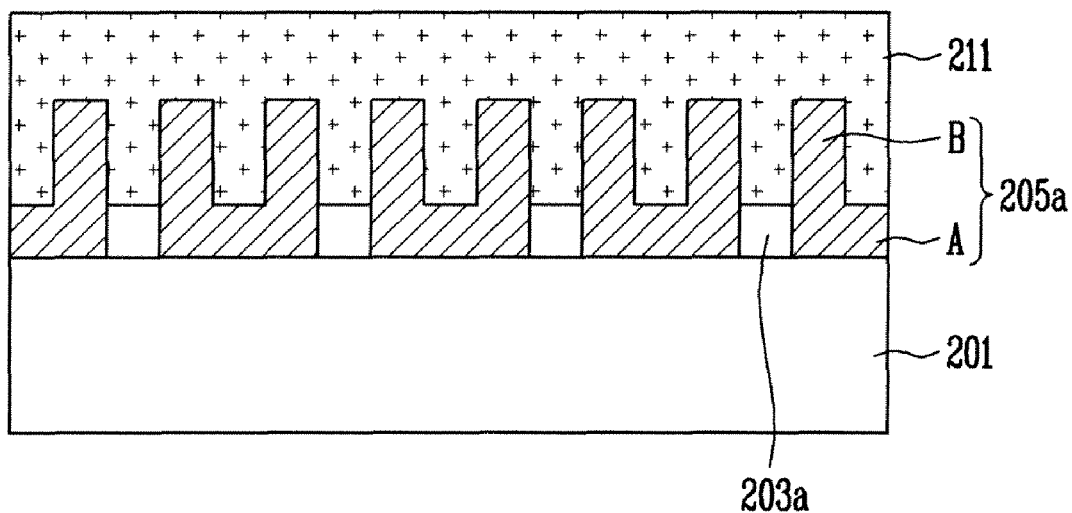

Referring to FIG. 2C, a conductive layer 211 is formed over the semiconductor substrate 201, including the trenches (refer to 209 of FIG. 1E), in such a way as to fill the trenches. The conductive layer 211 preferably comprises a metal material and preferably is formed using a CVD or ALD method.

Figure 2D:
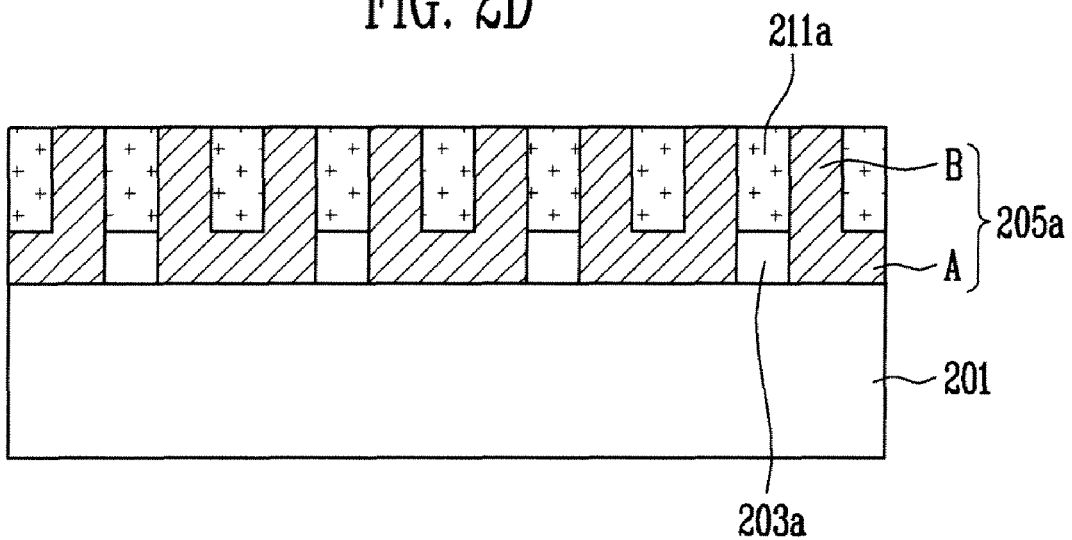

Referring to FIG. 2D, a polishing process is performed to expose the second insulating patterns 205a, thereby separating the conductive layer into a number of conductive patterns 211a. The polishing process preferably is performed using a CMP method.

The conductive patterns 211a preferably have a controlled interval according to a deposition thickness of the second and third insulating layers, and so have an interval that is smaller, on a micro scale, than an exposure resolution. Accordingly, a pattern pitch of the conductive patterns 211a according to the second embodiment of this disclosure can be smaller, on a micro scale, than an exposure resolution. Furthermore, even in the second embodiment of this disclosure, since the second insulating layer can be deposited to a uniform thickness using the method having an excellent step coverage characteristic, a line width of each of the trenches, defining a space in which the conductive pattern 211a will be formed, can be uniform. Accordingly, the line widths of the conductive patterns 211a filling the respective trenches can be uniform.

According to the disclosure, since a pattern pitch can be controlled according to a deposition thickness of an insulating layer, the limit to an exposure resolution can be overcome, and the patterns of a semiconductor device can be formed to have a micro pitch.

Furthermore, according to the disclosure, the insulating patterns are formed using a damascene method of filling the trenches, each provided between the insulating patterns. Accordingly, the insulating patterns can be prevented from collapsing. In addition, the auxiliary pattern or another insulating pattern remains on the bottom of the trench between the insulating patterns. Accordingly, the collapse of the insulating patterns defining the trenches can be more effectively prevented.

What is claimed is:

1. A method of forming patterns of a semiconductor device, comprising:
    forming first insulating patterns that define sidewalls by patterning a first insulating layer formed over a semiconductor substrate;
    forming second insulating patterns, each second insulating pattern comprising a horizontal portion having two ends and being parallel to the semiconductor substrate, and spaced protruding portions protruding from both ends of the horizontal portion parallel to sidewalls of the first insulating patterns;
    forming third insulating patterns, each third insulating pattern filling a space defined between the protruding portions;
    removing the protruding portions to form trenches between the first insulation patterns and the third insulating patterns; and
    forming conductive patterns within the respective trenches.

2. The method of claim 1, comprising forming the second insulating patterns and the third insulating patterns by:
    forming a second insulating layer over the semiconductor substrate comprising the first insulating patterns;
    forming a third insulating layer on the second insulating layer; and
    polishing the second insulating layer and the third insulating layer to expose the first insulating patterns.

3. The method of claim 2, comprising forming the second and third insulating layers using a deposition method having a step-coverage of 90% or more.

4. The method of claim 2, comprising forming the second and third insulating layers using a furnace method or an atomic layer deposition (ALD) method.

5. The method of claim 1, wherein:
    the second insulating patterns comprise a material different from the material of the first insulating layer, and
    the third insulating patterns comprise the same material as the first insulating layer.

6. The method of claim 1, wherein:
    the first insulating layer and the third insulating patterns comprise an oxide layer, and
    the second Insulating patterns comprise a nitride layer.

7. The method of claim 1, wherein:
    the first insulating layer and the third insulating patterns comprise a nitride layer, and
    the second insulating patterns comprise an oxide layer.

8. The method of claim 1, wherein an interval between the first insulating patterns is three times as large as a width of each of the first insulating patterns.

9. A method of forming patterns of a semiconductor device, comprising:

forming first insulating patterns that define sidewalls by patterning a first insulating layer formed over a semiconductor substrate;

forming second insulating patterns, each second insulating pattern comprising a horizontal portion having two ends and being parallel to the semiconductor substrate and spaced protruding portions protruding from both ends of the horizontal portion parallel to sidewalls of the first insulating patterns;

forming third insulating patterns, each third insulating pattern filling a space defined between the protruding portions;

removing the third insulating patterns and a portion of the respective first insulating patterns to form trenches between the protruding portions, wherein remaining portions of first insulating patterns become auxiliary patterns; and forming conductive patterns within the respective trenches between the protruding portions.

10. The method of claim 9, comprising forming the second insulating patterns and the third insulating patterns by:

forming a second insulating layer over the semiconductor substrate comprising the first insulating patterns;

forming a third insulating layer on the second insulating layer; and polishing the second insulating layer and the third insulating layer to expose the first insulating patterns.

11. The method of claim 10, comprising forming the second and third insulating layers using a deposition method having a step-coverage of 90% or more.

12. The method of claim 10, comprising forming the second and third insulating layers using a furnace method or an atomic layer deposition (ALD) method.

13. The method of claim 9, wherein:

the second insulating patterns comprise a material different from the material of the first insulating layer, and the third insulating patterns comprise the same material as the first insulating layer.

14. The method of claim 9, wherein:

the first insulating layer and the third insulating patterns comprise an oxide layer, and the second insulating patterns comprise a nitride layer.

15. The method of claim 9, wherein:

the first insulating layer and the third insulating patterns comprise a nitride layer, and the second insulating patterns comprise an oxide layer.

16. The method of claim 9, wherein an interval between the first insulating patterns is three times as large as a width of each of the first insulating patterns.

\* \* \* \* \*